(12) United States Patent
Toleno et al.

(10) Patent No.: US 11,839,054 B1
(45) Date of Patent: Dec. 5, 2023

(54) STACK-PCB DESIGN AND MIDPLANE ARCHITECTURE

(71) Applicant: Meta Platforms Technologies, LLC, Menlo Park, CA (US)

(72) Inventors: Brian Toleno, Cupertino, CA (US); Michael Nikkhoo, Saratoga, CA (US); Patrick Codd, Sammamish, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 22 days.

(21) Appl. No.: 17/482,229

(22) Filed: Sep. 22, 2021

(51) Int. Cl.
| | | |
|---|---|---|
| G06F 1/16 | (2006.01) | |
| H05K 5/00 | (2006.01) | |
| H05K 7/00 | (2006.01) | |
| H05K 7/20 | (2006.01) | |
| H05K 1/14 | (2006.01) | |
| H05K 7/06 | (2006.01) | |
| H05K 7/02 | (2006.01) | |
| H01L 25/065 | (2023.01) | |

(52) U.S. Cl.
CPC ..... *H05K 7/20336* (2013.01); *H01L 25/0657* (2013.01); *H05K 1/144* (2013.01); *H05K 7/023* (2013.01); *H05K 7/06* (2013.01)

(58) Field of Classification Search
CPC ....... H05K 7/20336; H05K 7/023; H05K 7/06
See application file for complete search history.

(56) References Cited

U.S. PATENT DOCUMENTS

| | | | | |
|---|---|---|---|---|
| 5,181,167 | A * | 1/1993 | Davidson | H05K 7/023 174/16.3 |
| 7,068,515 | B2 * | 6/2006 | Harris | H05K 7/1092 361/709 |
| 7,286,365 | B2 * | 10/2007 | Sarno | H01L 25/18 361/689 |
| 8,274,792 | B2 * | 9/2012 | Soffer | F28D 15/0275 361/721 |
| 9,547,344 | B2 | 1/2017 | Han | |
| 9,578,780 | B1 | 2/2017 | Shih et al. | |
| 9,639,127 | B2 | 5/2017 | Kim | |
| 2020/0344924 | A1 * | 10/2020 | Harrigan | H05K 3/3494 |
| 2021/0112656 | A1 * | 4/2021 | McCulley | H01L 23/473 |
| 2021/0384104 | A1 | 12/2021 | Doria et al. | |

FOREIGN PATENT DOCUMENTS

JP     2021188798 A     12/2021

\* cited by examiner

*Primary Examiner* — Anthony M Haughton
(74) *Attorney, Agent, or Firm* — Lee & Hayes, P.C.

(57) ABSTRACT

A multi-board system for an electronic device that includes an heat spreader between at least two boards. In examples, the multi-board system may include a stack-PCB architecture on one side of the heat spreader and one or more boards on an opposite side of the heat spreader from the stack-PCB. The heat spreader may comprise a vapor chamber and/or include a graphite layer or core to transfer heat along a length of the heat spreader.

20 Claims, 7 Drawing Sheets

STACK-PCB DESIGN AND MIDPLANE ARCHITECTURE

BACKGROUND

Product design generally includes one or more boards and/or flexible circuits to enable design. Printed Circuit Boards (PCB) are often employed to mechanically support and electrically connects complementary elements. One or more conductive tracks, pads and other features may be used to make the electrical connections. A PCB may include one or more sheets or layers of metal, such as copper, laminated onto and/or between sheet layers of a non-conductive substrate. There are different types of PCB used in the industry. For examples, a PCB can be a single layer PCB that has a single layer of conductive material only one side of the substrate, a double layer PCB that includes a layer of conductive material on both sides of a substrate, a multi-layer PCB with conductive material on both sides of the substrate, and conductive material sandwiched within the substrate, a high density interconnect (HDI) PCB that includes multiple conductive layers, laser drilled microvias, fine lines and tolerances, and advanced laminate materials, and a high frequency PCB designed to facilitate signals over 1 gigahertz. Flexible circuits, also known as flex circuit boards, are also a type of PCB. Flex circuits typically include a printed circuit board where the board has at least a bendable portion. Flex circuits are often used as flexible flat cable in place of cable wires and connectors. To provide structural stability to a computing device, metal frames are often employed. The metal frames, however, tend to be bulky and require sacrificing space in exchange for structural integrity and stability.

Existing designs employing PCBs mounted to metal frames and coupled together with flex circuits tend to result in complicated, messy packaging, tend to be heavy and bulky, and may be incapable of distributing and dissipating heat generated by portable devices with ever increasing performance requirements.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

DETAILED DESCRIPTION

Disclosed herein is a stack printed circuit board (stack-PCB) architecture for a product design that includes a midplane architecture including an heat spreader acting as an isothermal core and as a structural mid frame. The disclosed stack-PCB architecture may be employed in any computing device. In examples, the disclosed stack-PCB architecture may be employed in portable computing devices such as wearable devices, extended reality computing devices such as headsets or glasses, mobile phones, handheld computers, gaming devices, cameras, laptops or other portable computing devices. For purposes of this description a portable computing device refers to a computing device that a person of average size and strength is able to carry with one hand. In examples, the disclosed stack-PCB architecture may be employed in non-portable computing devices such as desktop computers, appliances, integrated computing components and the like.

In examples, the stack-PCB architecture may include one or more PCBs provided on a first side of the heat spreader. An heat spreader may serve as an isothermal core structure to transfer heat uniformly throughout the device to avoid temperature differentials (or hot spots). Also, by distributing heat throughout the device, it may be possible to dissipate more heat from an exterior of the device. This in turn may allow for higher performance processors, displays, and other heat generating components to be used, for longer periods of time, and/or at lower temperatures.

In examples, the stack-PCB architecture may include one or more complementary elements on a second side of the heat spreader. In examples, one or more complementary elements may include one or more PCBs. In examples, one or more complementary elements may include non-PCB components. In examples, the one or more complementary elements on the second side of the heat spreader may include sensor boards (including, for example, cameras, image sensors, microphones, temperature sensors, time of flight sensors, etc.), optics boards (including, for example, display screens, projectors, display drivers, etc.), inertia boards (including, for example, inertial sensors such as accelerometers or gyros, magnetometers, etc.), and/or radio frequency boards (e.g., including, for example, one or more radio frequency modules, radios, antennas, etc.). Any of the boards described as being on the first side may be located on the second side and vice versa. In some examples, components of multiple different types of boards may be combined with one another (e.g., any one or more of the boards may include RF components, sensors, inertial measurement components, optics components, and/or system components). The stack-PCB architecture may include multiple layers (e.g., two, three, four, or more layers) of boards. The number of layers provided on the first side of the heat spreader may be the same as or different than the number of layers on the second side of the heat spreader. In examples, a stack-PCB architecture as described may include a tri-layer structure on the first side of the heat spreader and the one or more complementary elements on the second side of the heat spreader may provide the same (e.g., three) or different number (e.g., one, two, four, etc.) of layers on the second side of the heat spreader as there are on the first side of the heat spreader. In some examples, one or more interposers may be disposed between layers of the stack-PCB architecture. The interposers provide a communication link between the respective layers of the stack-PCB system. The use of an interposer may reduce or eliminate connector count. The interposer(s) may also act as heat spreaders to further distribute heat evenly across the respective layers with which they are in contact. In some examples, an interposer may be configured to electrically and thermally couple between a first PCB and an RF board.

In examples, the stack-PCB architecture as described may provide a higher volumetric efficiency. In examples, the stack-PCB architecture may provide more processing power in a compact space and/or volume, allowing devices employing the stack-PCB arrangement according to this application to run more computationally intensive programs, for longer periods of time, and/or to operate at lower temperatures. In examples, the stack-PCB may provide a higher input/output count when compared to standard arrangements, allowing devices employing the stack-PCB arrangement according to this application to connect to more sensors or other components and/or to enable higher and/or higher bandwidth communications.

In examples, the heat spreader may distribute heat in a longitudinal direction (i.e., perpendicular to the layers of the stack-PCB). In examples, the heat spreader may include an isothermal plate. In examples, the heat spreader may include a vapor chamber. In examples, the vapor chamber may include a titanium vapor chamber. Additionally or alternatively, the heat spreader may include a core or one or more layers of graphite extending at least partially along a length of the heat spreader to enhance a heat transfer ability of the heat spreader in the longitudinal direction. The heat spreader may include additional or alternative heat transfer components or structures as described herein.

In examples, the stack-PCB architecture as described may provide an ability to align and/or orient the hardware to improve fan flow rate and/or reduce noise.

In examples, the stack-PCB architecture may result in decreased junction temperatures.

In examples, the combined structure of a stack-PCB architecture and heat spreader such as a vapor chamber or other heat spreader may exhibit improved rigidity. In examples, the combination of the stack-PCB architecture and heat spreader as described herein with one or more boards are arranged on the sides of the heat spreader may form a truss-like structure in which the various components are organized so that the assemblage as a whole can behave as a single object able to exhibit sufficient structural integrity and rigidity to provide a stable configuration that does not require additional framing. In examples, greater rigidity may lead to elevated mechanical frequencies and thus reduce or mitigate solder fatigue and/or fracture. In examples, the improved structural integrity provided by the combination of a stack-PCB architecture as described eliminates the need for a separate a middle frame or other added structural frame. This may lead to a more compact and/or light weight design particularly suitable for smaller computing devices such as wearable devices.

In examples, the stack-PCB architecture as described may simplify testing. In examples, the multi-board system can result in a more compact assembly with a smaller bill of material (BOM). This in turn may decrease challenges with design for manufacture and design for excellence. In examples, the stack-PCB architecture as described may include a design that may be readily scalable.

Product design traditionally uses discrete multi-layer boards and flexible circuits to enable design. The connection between the boards are typically made via connector and specific terminations as design and logistics dictate. This arrangement, however, often may lead to messy packaging as well as testing and debug challenges. These types of manufacturing inefficiencies can raise numerous issues. Moreover, the traditional packaging approach may have an adverse impact on thermal design, spatial optimization, and form factor. For example, the traditional packaging can impede air flow, it may lead to higher pressure drop, and/or may increase decibel noise level.

Accordingly, a more layered design may be advantageous to address the shortcomings of traditional packaging approach.

In examples, a stack printed circuit board architecture is provided including an heat spreader comprising a first side and a second side, the second side being opposite the first side, one or more printed circuit boards coupled to the first side of the heat spreader; and one or more complementary elements coupled to the second side of the heat spreader.

In examples, the one or more printed circuit boards may include a functional printed circuit board. In examples, the one or more printed circuit boards may include a system on chip printed circuit board.

In examples, the one or more printed circuit boards coupled to the first side may include a first printed circuit board and a second printed circuit board, and further may include an interposer located at the first side of the heat spreader and interposed between the first printed circuit board and the second printed circuit board.

In examples, the first printed circuit board may include a system on chip printed circuit board connected to the first side of the heat spreader, and the second printed circuit board may include a functional printed circuit board.

In examples, the one or more complementary elements may include one or more additional printed circuit boards. In examples, the one or more additional printed circuit boards may include at least two additional printed circuit boards. In examples, the one or more additional printed circuit boards may include at least one of a sensor board, an optics board, or an inertia board.

In examples, the one or more printed circuit boards may be arranged in parallel and may include one or more solder connections.

In examples, a first number of the one or more printed circuit boards coupled to the first side may be equal to a second number of the one or more printed circuit boards coupled to the second side of the heat spreader. In examples, a printed circuit board of the one or more printed circuit boards coupled to the first side may include at least one of a transistor, a diode, an integrated circuit, a resistor, or a capacitor.

In examples, the heat spreader may include a plate with a graphite core. In examples, the heat spreader may include a vapor chamber.

In examples, a method of forming an electronic device is provided including stacking one or more printed circuit boards on a first side of an heat spreader; and stacking one or more complementary elements on a second side of the heat spreader.

In examples, stacking one or more printed circuit boards may include electrically connecting a system on chip printed circuit board to the heat spreader via first connections; electrically connecting an interposer to the system on chip printed circuit board via second connections; electrically connecting a functional printed circuit board to the interposer via third connections; and coupling the system on chip printed circuit board, the interposer, and the functional printed circuit board to the heat spreader via one or more fasteners.

In examples, each of the first connections, the second connections, and the third connections may include solder connections. In examples, connecting a functional printed circuit board to the interposer may include connecting a radio frequency printed circuit board to the interposer. In examples, stacking one or more complementary elements may include connecting to the second side of the heat spreader at least one of a sensor board, an optics board, or an inertia board.

In examples, the heat spreader may include a vapor chamber and the stacking of one or more printed circuit boards may include connecting at least one printed circuit board to the first side of the vapor chamber using a first fastener, and the stacking of one or more complementary elements may include connecting at least one complementary element to the second side of the vapor chamber using a second fastener.

In examples, a computing device is providing including a stack printed circuit board architecture including an heat spreader comprising a first side and a second side, the second side being opposite the first side, one or more printed circuit boards coupled to the first side of the heat spreader; and one or more complementary elements coupled to the second side of the heat spreader.

Figure 1:
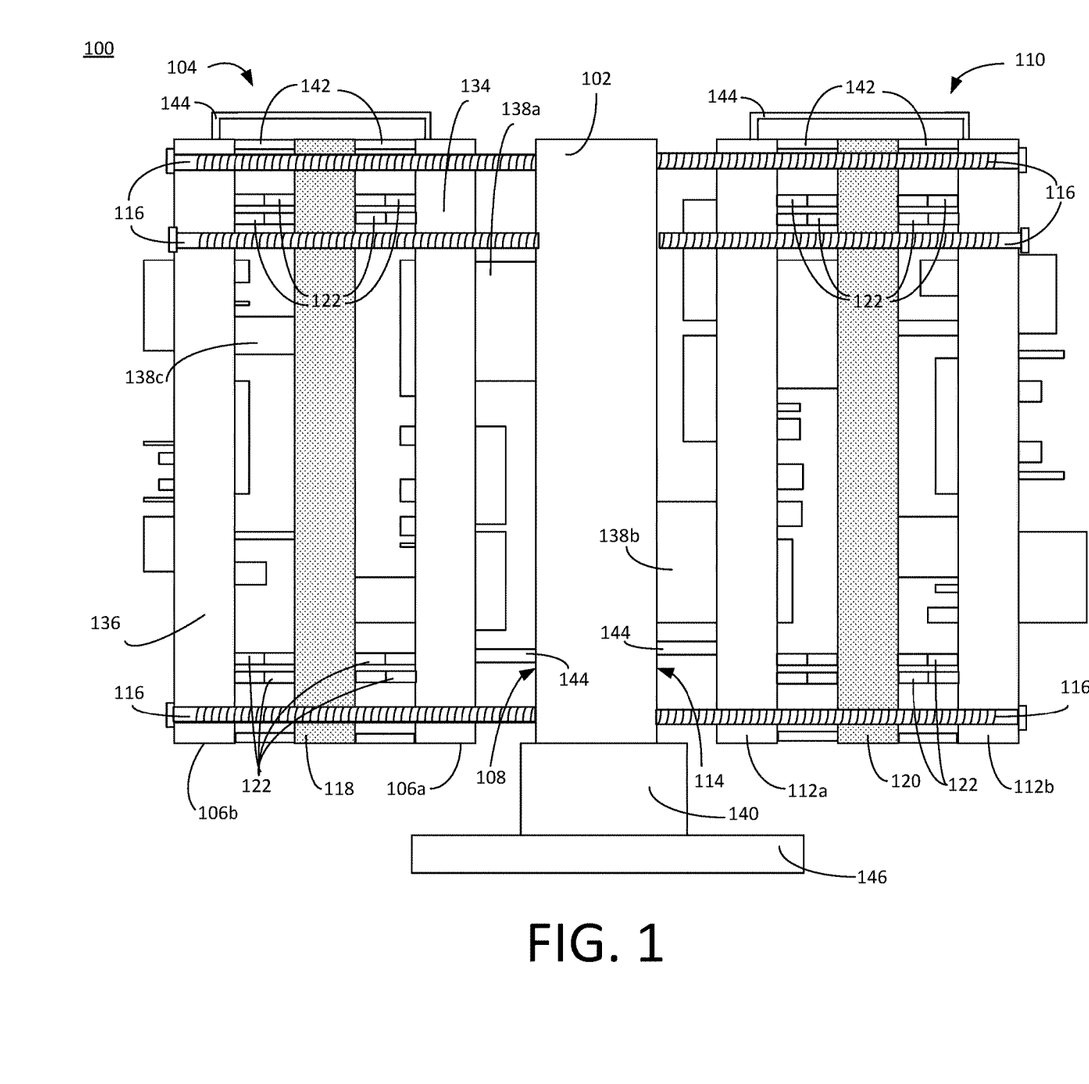
FIG. 1 illustrates a diagram of examples of a stack-PCB architecture as described herein.

FIG. 1 illustrates a cross-section view of examples of a stack-PCB architecture 100 as described. In examples, the stack-PCB architecture 100 may include a heat spreader 102 with a system stack 104 of one or more printed circuit boards 106 mounted onto a first side 108 of the heat spreader 102 and a complementary stack 110 of one or more complementary elements 112 mounted onto a second side 114 of the heat spreader 102.

Figure 2:
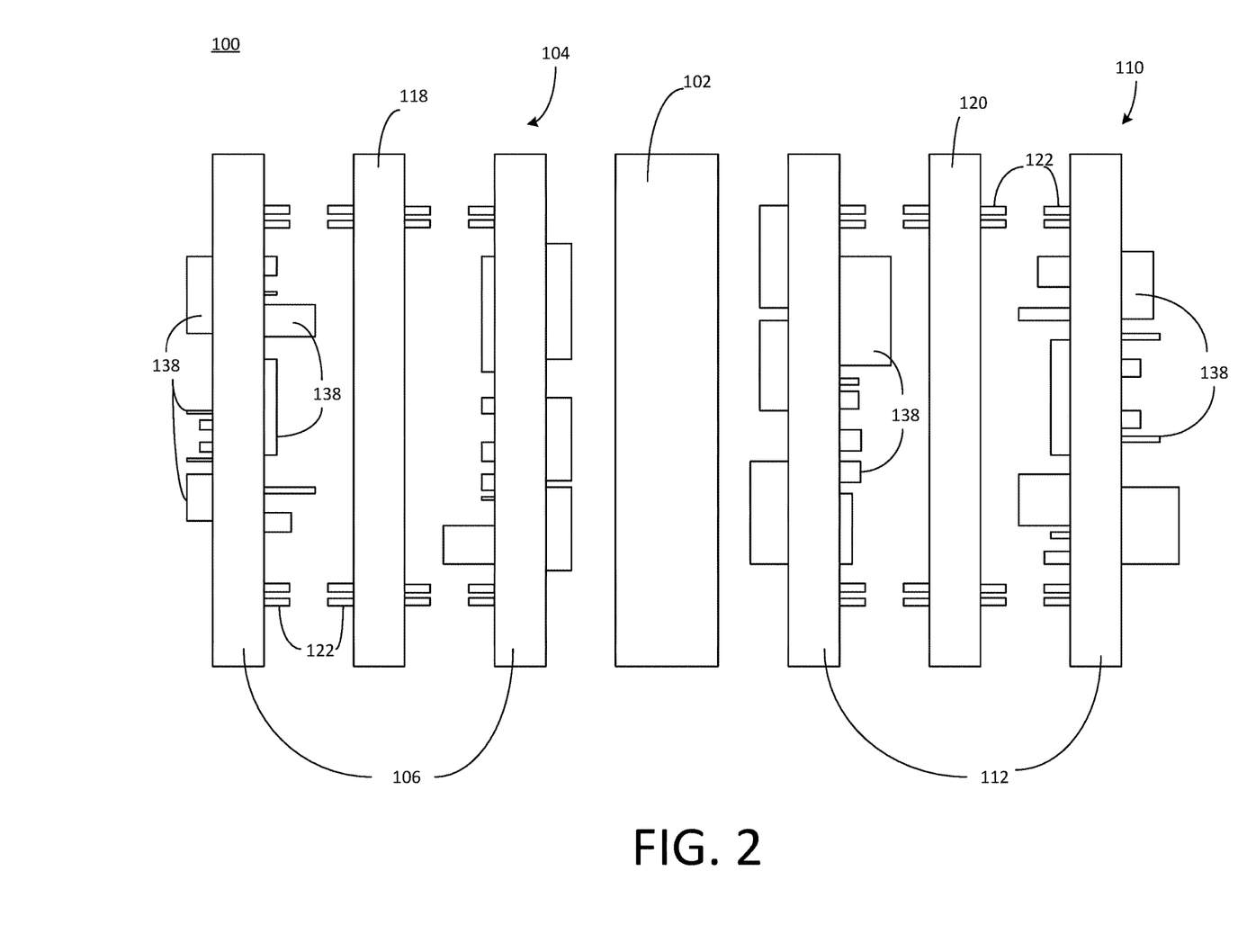
FIG. 2 illustrates an exploded diagram of examples of a stack-PCB architecture as described herein.
Figure 3:
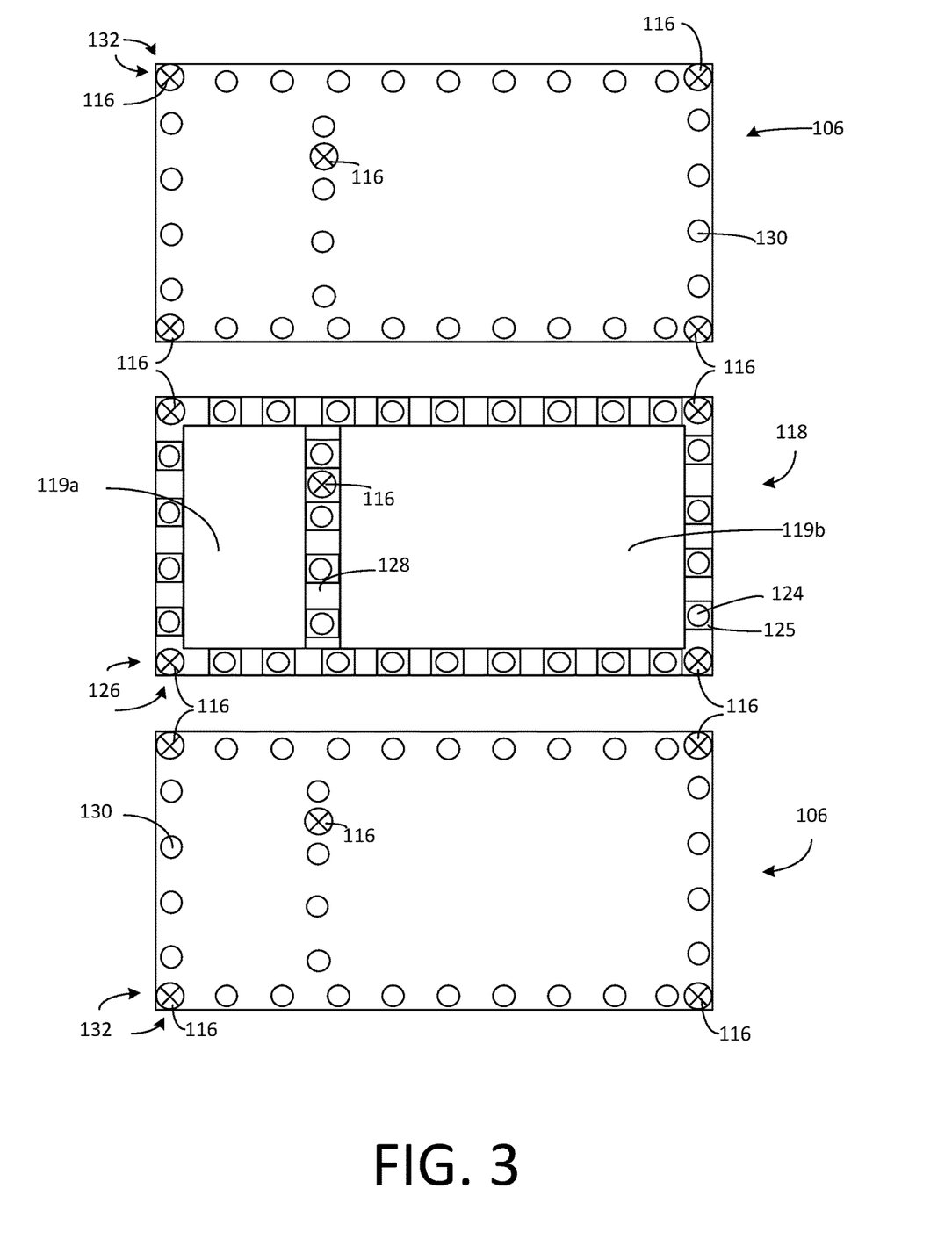
FIG. 3 illustrates a diagram of an interconnection between two printed circuit boards.

The different components of the stack-PCB architecture 100 may be fastened together using one or more fasteners 116. Any number of fasteners 116 may be used as desired or as may be necessary. In examples, fasteners 116 may include bolts, screws, pins, or like structures. In examples, fasteners 116 include bolts. In examples, fasteners 116 can be configured to engage heat spreader 102, one or more printed circuit boards 106, one or more complementary elements 112, or any combination thereof. In examples, fasteners 116 may be configured to additionally engage one or more additional structures provided in the stack-PCB architecture 100. In examples, fasteners 116 may be configured to engage one or more interposers 118, 120, or like structures. FIG. 1 illustrates separate fasteners 116 for the one or more printed circuit boards 106 and for the one or more complementary elements 112. This is only an example. In examples, one or more contiguous fastener 116 may be used to secure one or more printed circuit boards 106 and one or more complementary elements 112 of stack-PCB architecture 100. In examples, provisions may be provided around the perimeter of the heat spreader 102. For example, the heat spreader 102 may include one or more threaded studs extending out of plane or through-hole provisions. In examples, a fastener 116 does not traverse the active area of the heat spreader 102. FIG. 2 illustrates an exploded view of stack-PCB architecture 100 with the fasteners 116 removed. In examples, fasteners 116 may be provided at one or more corners of stack-PCB architecture 100 and/or at one or more central location of stack-PCB architecture 100. For example, as illustrated in FIGS. 1 and 3, in examples, one fastener 116 may be provided at each corner and one may be provided at an internal area of stack-PCB architecture 100. Fasteners 116 may be arranged in the symmetrically or asymmetrically about heat spreader 102.

In examples, stack-PCB architecture 100 may include a system stack 104 including one or more printed circuit boards 106 on a first side 108 of the heat spreader 102. As illustrated the one or more printed circuit boards 106 are shown as coextensive. However, this is only an example. Each one of the one or more printed circuit boards 106 may have any shape or size independent of any other component of the stack-PCB architecture 100. In examples, at least one of the one or more printed circuit boards 106 may have a larger area size than at least one other of the one or more printed circuit boards 106. In examples, a printed circuit board 106 may have a multilateral shape, a circular shape, an oval shape, and may have a regular or irregular shape. In examples, the number of printed circuit boards 106 that may be stacked on the first side 108 of the heat spreader 102 is not limited. As illustrated in FIGS. 1 and 2, in examples where two or more printed circuit boards 106 are provided, the printed circuit boards 106 may be arranged parallel to each other, to heat spreader 102, complementary stack 110, one or more complementary elements 112, or any combination thereof.

In examples, two or more printed circuit boards 106 may be interconnected via one or more interposers 118. In examples, an interposer 118 may be provided as an interconnecting structure between two consecutively arranged printed circuit boards 106. Other types of connectors other than interposer 118 may be used. In examples, two printed circuit boards 106 may also be directly connected to each other without an interposer 118. In examples, an interposer may offer a wide conduit or bridge for signal transfer while minimizing the distance between printed circuit boards. In examples, this may result in a reduced or minimized resistance and/or capacitance delay.

FIGS. 1 and 2 illustrate two printed circuit boards 106a and 106b in system stack 104, with a single interposer 118 connecting printed circuit boards 106a and 106b. In examples, system stack 104 may include only a single printed circuit board 106. In examples, system stack 104 may include three or more printed circuit boards 106. In examples where system stack 104 include three or more printed circuit boards 106, one or more interposers 118 may be provided between any two printed circuit boards 106. In examples, system stack 104 includes three or more printed circuit boards, the system stack 104 may include alternating printed circuit boards 106 and interposers 118.

In examples, an interposer 118 may include silicon and/or organic materials. As illustrated, an interposer 118 may include links that may be attached to a substrate by through silicon vias (TSVs) or through-chip vias. For purposes of this disclosure a TSV or through-chip via refers to a vertical electrical connection that passes completely through a wafer, substrate, or die. An interposer can be metallized from the top, bottom, and side to connect it to the surrounding components of the system.

In examples, an interposer 118 may include a heat transfer material. In examples, an interposer 118 may be configured to transfer, distribute, and/or diffuse heat. The heat conductivity of an interposer 118 may be isotropic or anisotropic. In examples, an interposer 118 can include an isothermal body.

In examples, connections between a printed circuit board 106 and an interposer 118 may be made via any suitable fashion. In examples, one or more connections between a printed circuit board 106 and an interposer 118 may include one or more solder bumps 122. FIG. 3 illustrates a top-down view of printed circuit boards 106*a* and 106*b* and interposer 118. The connection points 124 on interposer 118 may be arranged as desired. In examples, connection points 124 may be through silicon vias (TSVs). In examples, pads 125 may be formed at the location where TSV connection points 124 are to be provided. In examples, pads 125 may be metal pads. In examples, metal pads 125 can include any suitable metal such as, for example, copper, aluminum, titanium, or any alloy or combination thereof. In examples, as illustrated, connection points 124 on interposer 118 are provided at least along a portion of a peripheral region 126 of interposer 118. In examples, also as illustrated, one or more connection points 124 may be located at an internal portion 128 of interposer 118. In examples, any arrangement of connection points 124 may be implemented as desired.

In examples, as also shown in FIG. 3, a printed circuit board 106 may include one or more connection points 130. In examples, as illustrated, connection points 130 may be provided at a peripheral region 132 of a printed circuit board 106. In examples, connection points 130 may be provided anywhere on a surface of a printed circuit board 106. In examples, the size of a surface area of a surface of printed circuit board 106 facing an interposer 118 may be larger than, smaller than, or the same as the surface area of the surface of that of interposer 118 facing the printed circuit board 106. In examples, the dimensions of a printed circuit board 106 may be different from the dimensions of an interposer 118 to which it is connected. In examples, a printed circuit board 106 may have a peripheral region 132 that extends beyond a peripheral region 126 of an interposer 118 to which it is connected. In examples, where a printed circuit board 106 has greater dimensions than the interposer 118 to which it is connected, the connection points 130 of the printed circuit board 106 may be located at an internal surface area of printed circuit board 106 instead of at peripheral region 132. In examples, one or more connection points 130 on a printed circuit board 106 may be arranged so that when coupled to an interposer or other connector, at least some of the one or more connection points 130 on printed circuit board 106 may align with at least some of the one or more connection points 124 on interposer 118 and/or other connector. In examples, one or more connection points 130 on a printed circuit board 106 may be arranged so that when coupled to an interposer or other connector, at least some of the one or more connection points 130 on printed circuit board 106 may be misaligned with at least some of the one or more connection points 124 on interposer 118 and/or other connector.

As also shown in FIG. 3, in examples, interposer 118 may include a frame with one or more openings 119. In examples, as illustrated, interposer 118 includes a first opening 119*a* and a second opening 119*b*. In examples, interposers having openings 119 may provide additional space between consecutive printed circuit boards 106 to accommodate one or more electronic components 138 described later. For example, opening 119 may accommodate one or more electronic components 138 that have a height greater than the solder bump connection between the printed circuit board 106 and interposer 118.

In examples, an interposer 118 may provide shielding and/or protection against electromagnetic interference (EMI). In examples, this may be accomplished by including filler 142 between an interposer 118 and a printed circuit board 106. In examples, one or more fillers 142 as described herein may be provided between any interposer 118 and printed circuit board 106. In examples, at least one filler 142 is present between every interposer 118 and circuit board 106. In examples, the filler 142 may include a coating such as a paste coated along an exposed edge of interposer 118 to close a gap between an interposer 118 and one or more circuit boards 106. In examples, the coating or other filler material may be deposited along a peripheral edge of interposer 118 that overlaps with a peripheral edge of a connected circuit board 106. In examples, the filler 142 may include one or more shield cans may be inserted between an interposer 118 and one or more circuit boards 106 to improve shielding and/or EMI protection.

Although not illustrated, in examples, where an interposer 118 is absent, shielding and/or EMI protection may be achieved by providing a filler 142 such as a coating or shield can along a peripheral edge of one or both serially connected printed circuit boards 106 to fill a gap between them. In examples, one or more shield cans may be mounted on one or more printed circuit boards 106 so as to be located between serially connected printed circuit boards 106.

In examples, a witness line may be a source of noise (EMI/RFI). In examples, the stack-PCB architecture 100 may be configured to include one or more provisions to edge plate one or more printed circuit boards 106, gasketing to "plug" the witness line to reduce or eliminate noise, or a combination of both.

In examples, a printed circuit board 106 may have any desired design. In examples, a printed circuit board 106 be a single layer, double layer, or multi-layer printed circuit board, a high-density interconnect (HDI) PCB, and/or a high frequency PCB.

In examples, at least one printed circuit board 106 in system stack 104 may include a system on chip printed circuit board 134. A system on chip printed circuit board may also be referred to as motherboard, mainboard, or logic board. In examples, a system on chip printed circuit board may include a primary central processing unit (CPU) for the computing device of which the stack-PCB architecture is part. In examples, the system on chip printed circuit board may serve to connect the CPU to one or more other parts of a computing device. In examples, a system on chip printed circuit board may connect CPU to memory, one or more hard drives, one or more additional ports and expansion cards, or any combination thereof.

In examples, one or more printed circuit boards 106 may include one or more functional printed circuit boards 136. In examples, a functional printed circuit board 136 may also be referred to as daughter card. In examples, a functional printed circuit board 136 may include an interface printed circuit board. An interface printed circuit board may be one that allows interaction with a user and/or other device. In examples, an interface printed circuit board may allow a computing device to communicate with one or more peripheral devices. In examples, a function printed circuit board may include an RF printed circuit board. In examples, other types of printed circuit boards may be included in place of and/or in addition to an RF board. In examples, printed circuit boards 106 may include other types of boards such as a logic board, display board, communication board, sensors boards, optic boards, inertia board, or any other board that may be desired for the particular application.

In examples, system stack 104 may be arranged with the intention of maintaining an isothermal state across the stack-PCB architecture. In examples, the printed circuit board 106 that is part of system stack 104 that produces the greatest amount of heat compared to the one or more other printed circuit boards 106 that make up system stack 104 may be located closest to heat spreader 102. In examples, system stack 104 may be arranged so that system on chip printed circuit board 134 is closest to heat spreader 102. In examples, the system on chip printed circuit board 134 may be thermally coupled to heat spreader 102. In examples, one or more thermal transfer connections may be implemented to improve heat transfer from system on chip printed circuit board 134 to heat spreader 102. In examples, a functional printed circuit board 136 is arranged closest to and/or thermally coupled to heat spreader 102 with one or more thermal transfer connections to improve heat transfer from functional printed circuit board 136 to heat spreader 102.

In examples, one or more thermal interface material structures 144 may be including between any two printed circuit boards 106, between a printed circuit board 106 and an interposer 108, and/or between a printed circuit board 106 and heat spreader 102. Thermal interface material structures 144 is any material that may be inserted between two components in order to enhance the thermal coupling between them. In examples, the thermal interface material may include silicon pads, silicon-like material pads, or like structures. In examples, as shown in FIG. 1, a thermal interface material structure 144 may bridge two separate printed circuit boards 106. In examples, one or more heat pipes may be used in place of a thermal interface material structure 144 in the same manner.

In examples, heat spreader 102 may be an isothermal structure configured to absorb heat from system stack 104 and/or complementary stack 110 and redistribute it more evenly. In examples, heat spreader 102 may be any type of isothermal structure able to redistribute heat. In examples, heat spreader 102 may include an isothermal plate. In examples, heat spreader 102 may include a heat pipe or a structure such as a frame including one or more heat pipes. In examples, heat spreader 102 may include a plate with a graphite core. In examples, heat spreader 102 may include titanium.

In examples, heat spreader 102 may include a vapor chamber. Any type of vapor chamber may be employed. In examples, the vapor chamber may be formed of titanium. In examples, the vapor chamber may include one or more other materials in addition to and/or in place of titanium. For example, the vapor chamber may include aluminum, magnesium, graphite, copper, plated copper, solid metal slab lined with pyrolytic graphite, or any combination thereof.

Figure 4:
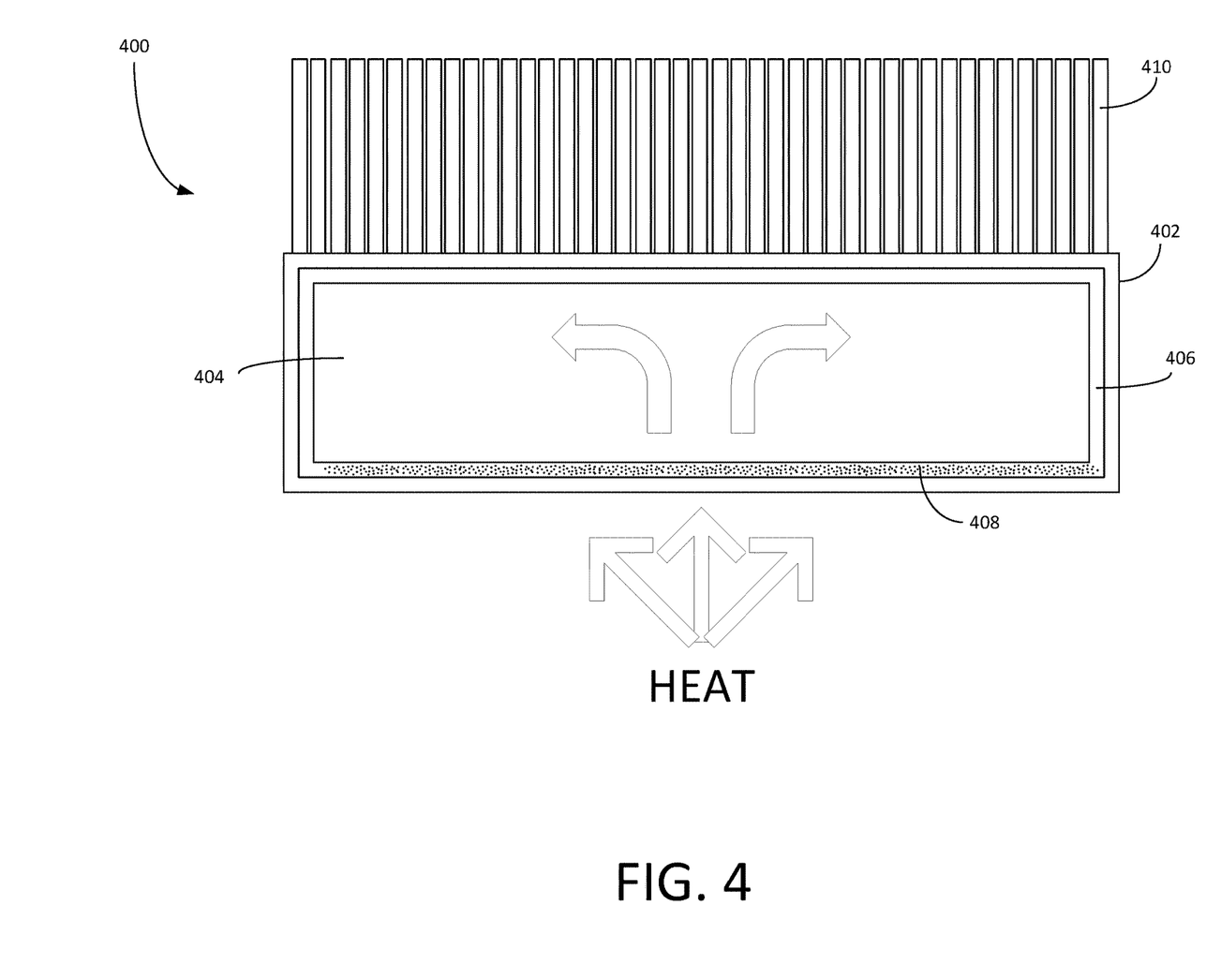
FIG. 4 illustrates a diagram of an example vapor chamber that can be used in connection with a stack-PCB architecture such as that shown in FIG. 1.

FIG. 4 illustrate a diagrammatic view of example vapor chambers and related operation. In examples, a vapor chamber 400 may include a shell 402, a steam chamber 404, a wick 406, and a liquid 408. In examples, a vapor chamber 400 may include one or more fins 410, such as stamped fins, to improve thermal management and improve heat transfer capabilities. In examples, heat input into the vapor chamber may cause the liquid 408 to evaporate from the wick 406 and fill the steam chamber 404 thus redistributing the heat across the whole chamber. As the liquid 408 cools, it may condense and return to the wick 406. In examples, the wick 406 may include copper, titanium, aluminum or any combination thereof. In examples wick 406 may include a microporous structure that is able to collect condensate through capillary action. In examples, the liquid 408 can be water or $H_2O$. Other liquids may also be employed. In examples, shell 402 may include made of metals (e.g., titanium, aluminum, magnesium, steel, or alloys thereof), high strength polymers (such as polyamideimide (PAI), polyetherimide (PEI), polyetheretherketone (PEEK), polyphenylene sulfide (PPS), Nylon, with or without fiber reinforcement), and/or composites such as carbon fiber or fiberglass. In some examples, the shell may include internal vessels or "channels" throughout all or part of the shell to hold a working fluid (e.g., water, glycol/water solutions, alcohol, acetone, dielectric coolants, etc.) that may be used to actively remove heat from components coupled to the shell. In some examples, the working fluid may be circulated through the channels via capillary action and thermal differentials throughout the shell. In some examples, the working fluid may be actively pumped throughout the shell to increase the rate at which the working fluid circulates through the channels.

Figure 5:
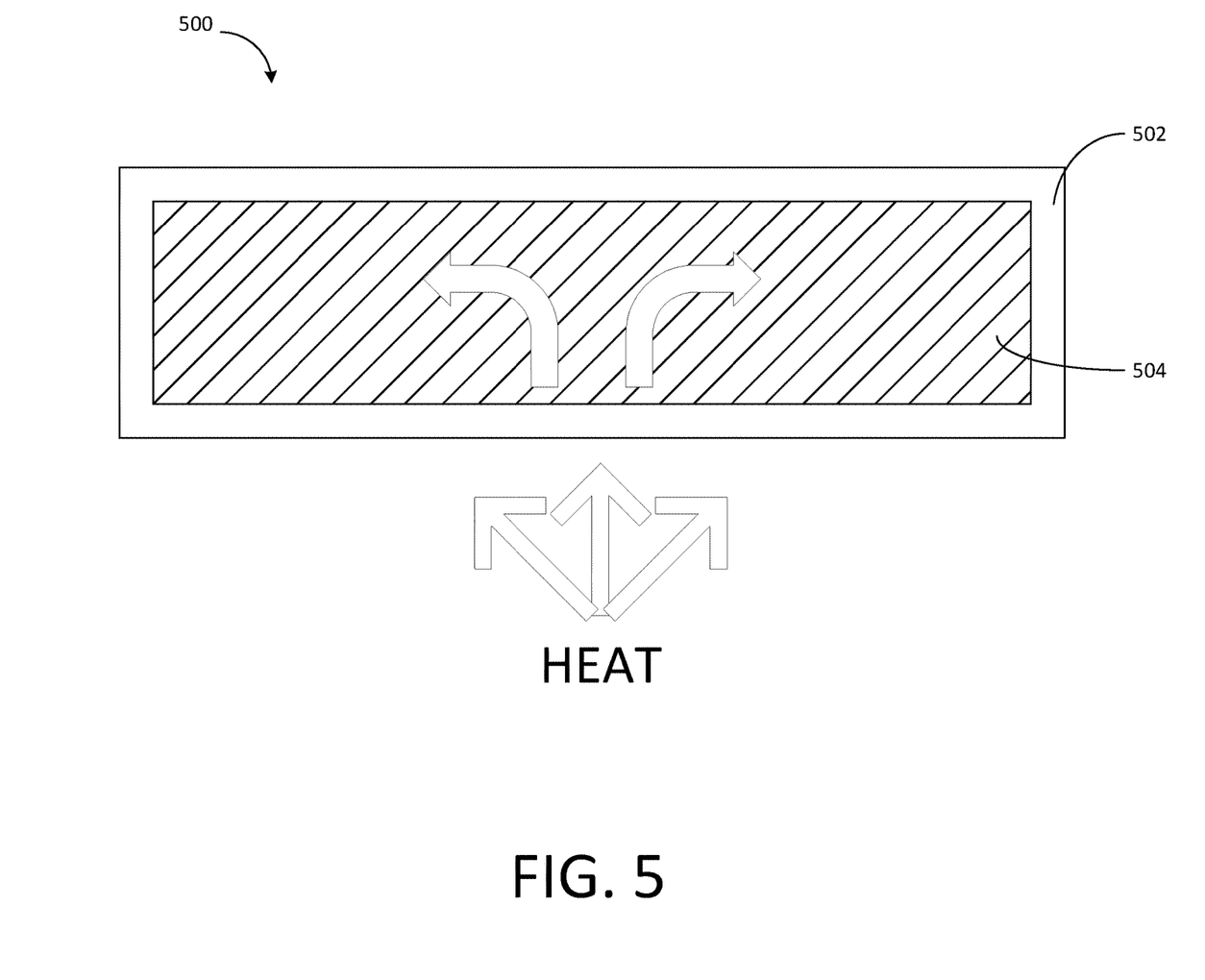
FIG. 5 illustrates a diagram of an example heat spreader plate with a graphite core or layer that can be used in connection with a stack-PCB architecture such as that shown in FIG. 1.

FIG. 5 illustrates a diagram of an example heat spreader 500 including a plate structure 502, for example an isothermal plate, including a metal, ceramic, a composite, or any combination thereof, with a graphite core 504 encapsulated into the plate structure. In examples, the graphite can include annealed pyrolytic graphite. In examples, as shown, heat is transferred to the plate structure 502 and into the graphite core. Graphite may exhibit high thermal conductivity and thus may be able to then spread the heat across the overall graphite core and/or plate structure.

In examples, stack-PCB architecture 100 may include a complementary stack 110 including one or more complementary elements 112 on a second side 114 of the heat spreader 102. In examples, the one or more complementary elements 112 may include one or more board or board-like structures. Board-like structure refers to a structure that has a given thickness between two flat surfaces. The peripheral shape of a board or board-like structure is not particularly limited and can be any multilateral shape, circular shape, oval shape, and any regular or irregular shape. In examples, the one or more complementary elements 112 may include the same size and shape as one or more printed circuit boards 106 of system stack 104.

In examples the one or more complementary elements 112 may be arranged to be parallel to heat spreader 102, system stack 104, and/or one or more printed circuit boards 106. In examples, where two or more complementary elements 112 are present, they may be arranged parallel to each other. In examples, the one or more complementary elements 112 may be mounted to heat spreader 102 via one or more fasteners 116 as previously described.

In examples, two or more complementary elements 112 of complementary stack 110 may be interconnected together. In examples, any connecting device may be used to connect one complementary element 112a to another complementary element 112b. In examples, two or more complementary elements 112 may be directly connected to each other. In examples, similar fillers 142 for shielding and/or EMI protection may be provided between serially connected complementary elements 112 as described for serially connected printed circuit boards 106.

In examples, as previously stated, a witness line may be a source of noise (EMP/RFI). In examples, the stack-PCB architecture 100 may be configured to include one or more provisions to edge plate one or more complementary elements 112, gasketing to "plug" the witness line to reduce or eliminate noise, or a combination of both.

In examples, as shown in FIGS. 1 and 2, an interposer 120 or similar structure may be used to interconnect two complementary elements 112 in a similar manner as described earlier with respect to interposer 118 and printed circuit boards 106. In examples, a complementary element 112 may be connect to an interposer 120 via one or more solder bumps 122. In examples, interposer 120 may be similar to the previously described interposer 118 and include the same or similar features described for interposer 118. In examples, interposer 120 may include a structure configured to transfer, distribute, and/or diffuse heat as described for interposer 118. In examples, similar filler 142 for shielding and/or EMI protections described earlier for interposer 118 may be implemented for interposer 120. In examples, fillers 142 may be provided between any interposer 120 and complementary element 112. In examples, at least one filler 142 is present between every interposer 120 and complementary element 112. In examples, two or more complementary elements 112 may be interconnected directly using solder bumps without an interposer 120. In examples, two or more complementary elements 112 may be connected via standard connectors such as one or more flex circuits. In examples, one or more complementary elements 112 and/or any electronic component 138 provided on a complementary element 112 may be connected to any other structure, element, printed circuit board, and/or component via any of interposer 120, direct connection, and/or standard flex circuit or other traditional connector.

As illustrated in FIGS. 1 and 2, by using one or more interposers 118 and/or 120, it may be possible to eliminate flex circuits from the stack-PCB architecture. This may lead to a less cluttered packaging and improved airflow. In examples, the short and more direct connections achievable by one or more interposers 118 and/or 120 may also lead to minimized signal delay and/or signal noise. In examples, one or more interposer 118 and/or 120 may be configured to transfer, distribute, and/or diffuse heat and improve heat diffusion across the stack-PCB architecture, and thus may improve isothermal conditions of the stack-PCB architecture.

In examples, one or more complementary elements 112 may include electrically conductive material, electrically insulating material, or a combination thereof. In examples, one or more complementary elements 112 may include passive components, active components, or a combination thereof. In examples, one or more complementary elements 112 may exhibit no functionality.

In examples, the one or more complementary elements 112 may include one or more printed circuit boards. In examples, one or more complementary elements 112 may include a processor. In examples, one or more complementary elements 112 may include combination of a processor and one or more system components such as sensors. In examples, one or more complementary elements 112 may include one or more inertia boards, sensors boards, optic boards, or any combination thereof. In examples, sensors boards may include tracking sensors such as, for example, eye tracking or face tracking, or other sensors such as external sensors, internal sensors and the like. In examples, one or more electrical connections may be provided between any two complementary elements 112. Electrical connections may be made using an interposer 120 as previously described. In examples, in addition to or in place of an interposer 120, one or more connections may be made using a flex circuit, direct connection, or any like structure.

In examples, complementary stack 110 may be arranged with the intention of maintaining an isothermal state across the stack-PCB architecture. In examples, the complementary element 112 that is part of complementary stack 110 that produces the greatest amount of heat compared to the one or more other complementary elements 112 that make up complementary stack 110 may be located closest to heat spreader 102. In examples, a complementary element 112 may be thermally coupled to heat spreader 102. In examples, one or more thermal transfer connections may be implemented to improve heat transfer from a complementary element 112 to heat spreader 102 as described previously for system on chip printed circuit board 134 or functional printed circuit board 136.

In examples, one or more thermal interface material structures 144 may be including between any two complementary elements 112, between a complementary element 112 and an interposer 120, and/or between a complementary element 112 and heat spreader 102. In examples, the thermal interface material may include silicon pads, silicon-like material pads, or like structures as previously described. In examples, as shown in FIG. 1, a thermal interface material structure 144 may bridge two separate complementary elements 112. In examples, one or more heat pipes may be used in place of a thermal interface material structure 144 in the same manner.

As illustrated in FIGS. 1 and 2, one or more printed circuit boards 106 of system stack 104 and/or one or more complementary elements 112 of complementary stack 110 may include one or more electronic components 138. In examples, one or more electronic components 138 may be present on one or more sides of a printed circuit board 106 and/or complementary element 112. As illustrated in FIGS. 1 and 2, in examples one or more electric components 138 may be present on opposite sides of one or more printed circuit boards 106 and/or one or more complementary elements 112. The type and arrangement of one or more electronic components 138 on any one printed circuit board 106 and/or complementary element 112 can be selected based on the desired functionality. In examples, one or more electronic components 138 may include active devices, passive devices, or a combination of both. Passive devices may include resistors, capacitors, inductors, diodes, crystals, relays, and other like structures. Active devices may include transistors, integrated circuits (IC), and other like structures. In examples, one or more printed circuit boards 106 and/or one or more complementary elements 112 may include a ball grid array design to enable the mounting of one or more electronic components 138.

In examples, to ensure that thermal energy is generally distributed across the stack-PCB architecture and ideally isothermal conditions are achieved, the one or more printed circuit boards 106 of system stack 104 and the one or more complementary elements 112 of complementary stack 110 may be configured with one or more electronic components 138 in a manner that distributes the overall load. In examples, heavy load components 138 and/or heavy load arrangements of components 138 may be provided in separate printed circuit boards 106 and/or complementary elements 112. In examples, printed circuit boards 106 and/or complementary elements 112 that carry heavier loads compared to other printed circuit boards 106 and/or complementary elements 112 may be arranged closest to heat spreader 102.

In examples, the stack-PCB architecture to allow for direct transfer of a heat between an electronic component 138 and heat spreader 102. In examples, as illustrated, an electronic component 138a and/or an electronic component 138b may be provided on a printed circuit board 106 and/or complementary element 112 an extend to contact heat spreader 102. In examples, as illustrated, an electronic component 138c may be arranged to also contact an adjacent layer and transfer heat directly to that adjacent layer. In examples, promoting heat transfer between electronic components 138, and particularly those electronic components 138 that generally carry a high load and/or generate a high degree of heat such as a laser diode, and adjacent layers and/or heat spreader may assist in achieving a more isothermal profile across the stack-PCB architecture.

In examples, the complementary stack 110 may include one or more complementary elements 112 and/or interposers 120 each forming a layer of complementary stack 110. Similarly, system stack 104 may include one or more PCBs 106 and/or interposers 118 each forming a layer of system stack 104. In examples, the number of layers of system stack 104 may be the same as the number of layers of complementary stack 110. In examples, the number of layers of system stack 104 may be different from the number of layers of complementary stack 110. In examples, the number of PCBs 106 and/or complementary elements 112 may be based on the desired functionality of the system. In examples, system stack 104 and complementary stack 110 both include at least one layer. In examples, system stack 104 includes at least one PCB and complementary stack 110 includes at least one complementary element 112 or interposer 120.

In examples, the system stack 104 is mounted onto the first side 108 of heat spreader 102 and complementary stack 110 is mounted onto the second side 114 of heat spreader 102 wherein the first side 108 and second side 114 are opposite each other as illustrated in FIG. 1. By arranging system stack 104 and complementary stack 110 on opposite sides of heat spreader 102, it may be possible to take advantage of the moment of inertia of the stack-PCB architecture and achieve a level of sufficient rigidity that does not require the incorporation of an additional middle frame structure. The elimination of a middle frame structure can lead to a smaller, more compact design. A smaller or more compact product design can be employed in smaller computing devices.

In examples, system stack 104, complementary stack 110, and heat spreader 102 may be arranged parallel to each other. In examples, every layer of system stack 104 and of complementary stack 110 may arranged parallel to each other and to heat spreader 102. Such parallel arrangement in the stack-PCB architecture can provide a more efficient cooling system. In examples, a computing device incorporating the stack-PCB architecture may include a venting device 146, such as a computer fan or like device. In examples, a computer fan 146 or similar structure may be configured to cause air flow or movement among the various structures.

In examples in which the stack-PCB architecture provides a parallel arrangement as illustrated, for example, in FIG. 1, i.e. where all the layers of the system stack 104 and complementary stack 110 are parallel to each other and to heat spreader 102, it may be possible to arrange a fan 146 to efficiently cause air flow between the layers and thus increase the cubic feet per minute rate of air flow and thus the cooling of the stack-PCB architecture.

In examples, a computing device employing a stack-PCB architecture 100 may include one or more heat sinks 140. In examples, as shown in FIG. 1, heat sink 140 may be connected to heat spreader 102. In examples, one or more heat sinks 140 may be coupled to a printed circuit board 106, a complementary element 112, an electrical component 138, or any combination thereof. In examples, a heat sink 140 may assist in dissipating heat from stack-PCB architecture 100. In examples, a heat sink 140, a thermal interface material structure 144, or like structure such as a heat pipe or the like may be arranged to transfer heat from at least a portion of the stack-PCB architecture 100 and a housing or other structure proximate to and/or surrounding the stack-PCB architecture 104. In examples, a heat sink 140 may include a heat exchanger configured to transfer heat. In examples, heat sink 140 may include one or more fins as similarly described for vapor chamber 400. In examples, heat sink 140 may include a thermally conductive material. In examples, heat sink 140 may include aluminum.

In examples, a heat sink 140 may be employed in conjunction with a fan or like venting device 146 as previously described. In examples, a fan may be arranged to efficiently cause air flow across the heat sink 140. In examples, a computer fan and a heat sink 140 may be arranged so that maximum air flow may pass across the surface of the heat sink to maximize heat dissipation. Maximizing air flow across heat sink 140 may increase the cubic feet per minute rate of air flow through the computing package and thus improve the cooling of the stack-PCB architecture.

In examples, the fan 146 may be arranged so that the stack-PCB architecture and/or heat sink 140 may be arranged to be aligned with the airflow caused by the fan. In examples, the fan may be arranged and/or aligned so that airflow caused by the fan may be directed to flow between two or more printed circuit boards, between one or more printed circuit boards and one or more interposers, between one or more printed circuit boards and the heat spreader, between two or more complementary elements, between one or more complementary elements and one or more interposers, between one or more complementary elements and the heat spreader, or any combination thereof. In examples, air may flow through one or more ducts provided in stack-PCB architecture and/or heat sink 140 to improve heat dissipation. This may be especially beneficial given the short connections achievable via the stacking arrangement via solder bumps as described that can lead to increase operation wattage ranging from 5 Watts to at least 15 Watts.

In examples, one or more heat sinks 140 may be connect to heat spreader 102, one or more printed circuit boards 106, one or more complementary elements 112, or any combination thereof by any suitable means. In examples, the connection may be made via thermal adhesive and/or thermal paste. In examples, the connection may be made via a thermally conductive epoxy compound, silicon compound, or any combination thereof. In examples, the connection may be made via one or more mechanical fasteners such as screws, bolts, fitting, clips, clamps, rivets, push pins, brackets or other like device. Any combination of adhesive, paste, and mechanical fastener may also be employed.

Figure 6:
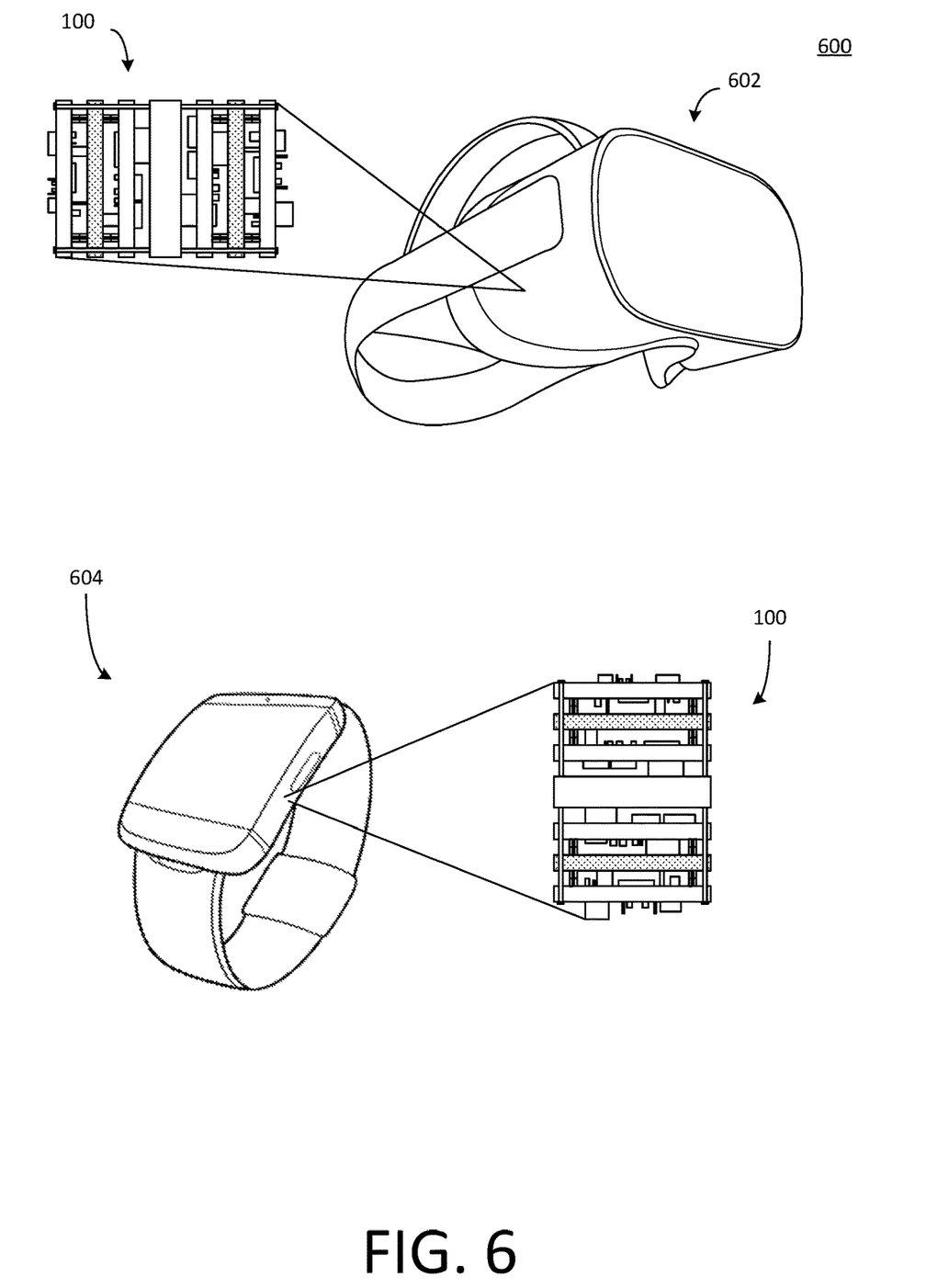
FIG. 6 illustrates product implementation examples for a stack-PCB architecture as described herein.

FIG. 6 illustrates an example computing device 600 in which the above described stack-PCB architecture 100 may be employed. The computing device 600 may be any computing device as previously stated. In examples, the disclosed stack-PCB architecture may be employed in portable computing devices such as wearable devices such as a smart watch, augmented reality computing devices, virtual reality computing devices, extended reality computing devices such as headsets and glasses, mobile phones, handheld computers, cameras, gaming devices, laptops or other portable computing devices. In examples, the disclosed stack-PCB architecture may be employed in non-portable computing devices such as desktop computers, appliances, integrated computing components and the like. As shown in FIG. 6, computing device 600 may include, be a part of, or function in conjunction with a virtual reality device such as for example, a virtual reality headset 602 or wearable computing device such a smart watch 604. These are only examples.

In examples, the disclosed stack-PCB architecture as described may be well suited for augmented reality (AR) and/or virtual reality (VR) devices. AR and VR devices often require high processing powers that can generate high temperatures. This is particularly when the device is shrunk to a wearable size or smaller. In examples, employing a stack-PCB architecture as described can allow the use of a stack PCB structure in AR and/or VR devices. In examples, the ability to employ a stack-PCB architecture as described in an AR and/or VR computing device may be due at least in part to the isothermal conditions that may be maintained. In examples, an AR and/or VR computing device includes one or more stack-PCB architectures as described herein.

Figure 7:
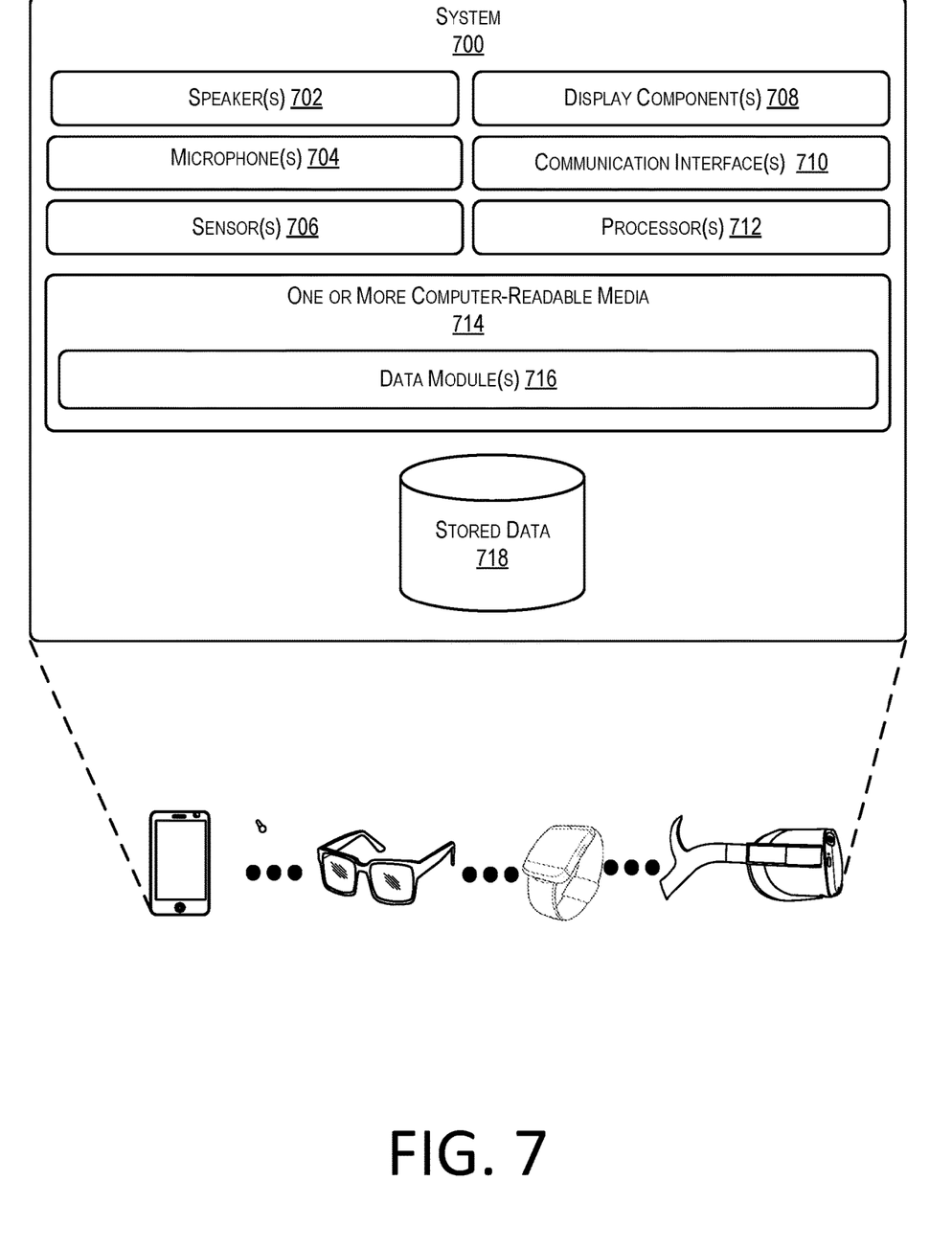
FIG. 7 is an example system that may be implemented using a stack-PCB architecture as described herein.

FIG. 7 is an example system 700 that may be implemented employing one or more stack-PCB architectures 100. The system 700 is simply an examples and not intended to limit the application of the stack-PCB architecture 100. In examples, multiple stack-PCB architectures 100 may be employed to provide the logic to support one or more components of system 700. In examples using more than one stack-PCB architecture 100, each stack-PCB architecture 100 may include its own heat spreader 102. In examples, a common heat spreader 102 may be employed for multiple stack-PCB architectures 100. In examples, using two or more stack-PCB architectures 100, any two or more stack-PCB architectures 100 may be in communication with each other and/or interconnected. Connections between stack-PCB architectures 100 may be provided via any suitable means including flex circuits, rigid connectors, cables or any similar device.

In examples, system 700 may be configured to perform various functions. In the illustrated example, system 700 may be configured to provide or deliver visual and/or audio content to a user engaged with a headset device and/or one or more earbuds. In some cases, the system 700 may include a speaker 702 which may incorporate one or more drivers as described herein, where the speaker 702 and/or driver is in proximity to or shares a structure/substrate with a microphone 704.

In examples, a microphone 704 may be configured to generate audio data and/or an audio signal representative of noise or sound in an associated environment, such as the environment surrounding a user, an ear canal of a user, and the like. In some instances, the microphone may be configured to detect noise or sound originating from a particular direction or specific relative areas (such as a mount of a user). In examples, one or more sensing components of microphone 704 may be implemented either as a functional printed circuit board 136 and/or as a sensors board provided as a complementary element 112.

The system 700 may also include one or more sensors 706 or other device for generating vibrational data associated with the system 700. For example, in some cases, the sensors 706 may comprise one or more IMUS, accelerometers, gyroscopes, magnetometers, or a combination thereof. For instance, in one implementation, sensors 706 may comprise three accelerometers placed orthogonal to each other, three rate gyroscopes placed orthogonal to each other, three magnetometers placed orthogonal to each other, and a barometric pressure sensor to provide mechanical vibration data or signals along three axes. In examples, the sensor boards operational in the one or more sensors 706 may also be implemented as either a functional printed circuit board 136, or as a complementary element 112. In examples, one or more sensors logics may be included in a system on chip printed circuit board 134.

In some examples, the system 700 may also include display components 708 for providing or presenting visual content to a user. For example, the display components 708 may present two-dimensional visual content or three-dimensional visual content (such as virtual reality content, mixed reality content, or augmented reality content). The display components 708 may be reflective, emissive, or a combination of both. In some examples, the display components 708 may include electrophoretic displays, interferometric modulator displays, cholesteric displays, backlit liquid crystal displays (LCDs), light emitting diode (LED) displays, waveguides, and so forth. In examples, display logic associated with display components 708 may include one or more heavy load electrical components 138. In examples, the electrical components 138 associated with display components 708 may be provided on a separate printed circuit board 106 and/or complementary element 112. In examples, the printed circuit board 106 and/or complementary element 112 hosting the one or more electrical components 138 of display component 708 may be arranged closer to heat spreader 102 relative to one or more other printed circuit boards 106 and/or other complementary elements 112 of a given stack-PCB architecture.

In examples, system 700 may include one or more communication interfaces 710 configured to facilitate communication between one or more networks, one or more cloud-based system, and/or one or more physical objects, such as hand-held controller. The communication interfaces 710 may also facilitate communication between one or more wireless access points, a master device, and/or one or more other computing devices as part of an ad-hoc or home network system. The communication interfaces 710 may support both wired and wireless connection to various networks, such as cellular networks, radio, WiFi networks, short-range or near-field networks (e.g., Bluetooth®), infrared signals, local area networks, wide area networks, the Internet, and so forth. In some cases, the communication interfaces 710 may be configured to wirelessly and communicatively couple the earbuds to the headset device. In examples, communication interface 710 may include logics mounted onto a functional printed circuit board 136, such as for example an RF board, and/or a complementary element 112 of a stack-PCB architecture 100.

In examples, system 700 may also include one or more processors 712, such as at least one or more access components, control logic circuits, central processing units, or processors, as well as one or more computer-readable media 714 to perform the function associated with the virtual environment. Additionally, each of the processors 712 may itself comprise one or more processors or processing cores. In examples, one or more processors 712 may be provided on a system on chip printed circuit board 134 of a stack-PCB architecture 100. In examples, the one or more processors 712 can include any suitable processor depending on the application for the device. In examples, one or more processors 712 may include CPUs, graphic processing units (GPUs), holographic processors, other microprocessors, as well as microcontrollers, FPGAs, ASICs, DDICs, etc.

Depending on the configuration, the computer-readable media 714 may be an example of tangible non transitory computer storage media and may include volatile and non-volatile memory and/or removable and non-removable media implemented in any type of technology for storage of information such as computer readable instructions or modules, data structures, program modules or other data. Such computer readable media may include, but is not limited to, RAM, ROM, EEPROM, flash memory or other computer-readable media technology, CD-ROM, digital versatile disks (DVD) or other optical storage, magnetic cassettes, magnetic tape, solid state storage, magnetic disk storage, RAID storage systems, storage arrays, network attached storage, storage area networks, cloud storage, or any other medium that can be used to store information and which can be accessed by the processors 712. In examples, computer-readable media 714 may be housed on a system on chip printed circuit board 134, a functional printed circuit board 136, and/or one or more complementary elements 112.

In examples, one or more data modules 716 such as instruction, data stores, and so forth may be stored within the computer-readable media 714 and configured to execute on the processors 712. By way of example and not limitation, the data module(s) 716 may include software programs such as an operating system, one or more application programs such as internet browsing software, extended reality software, audio and/or video media player software, gaming software, camera capture software, image viewer and/or editor software, social networking software, productivity software (e.g., computer aided design, word processing software, database software, spreadsheet software, drawing software, animation software, video editing software, etc.), communications software (e.g., email, text/video/voice messaging, voice and/or video calling, conferencing, etc.), and/or any other software commonly used in connection with portable computing devices.

As noted above, in some examples, the stacked printed circuit board architecture described herein may be used in portable computing devices such as, but not limited to, head-mounted devices (e.g., a headset, glasses, visor, etc.) or other wearable device (e.g., gloves, suit, etc.). Such extended reality devices may include extended reality headsets that allow users to view, create, consume, and/or share media content. In some examples, extended reality headsets may include a display structure having a display which is placed over eyes of a user and allows the user to "see" or otherwise perceive the extended reality content or environment. As discussed further below, the term "extended reality" includes virtual reality, mixed reality, and/or augmented reality.

As used herein, the term "extended reality environment" refers to a simulated environment in which users can fully or partially immerse themselves. For example, an extended reality environment can comprise virtual reality, augmented reality, mixed reality, etc. An extended reality environment can include computer generated objects and elements with which a user can interact. In many cases, a user participates in an extended reality environment using a computing device, such as a dedicated extended reality device. As used herein, the term "extended reality device" refers to a computing device having extended reality capabilities and/or features. In particular, an extended reality device can refer to a computing device that can display an extended reality graphical user interface. An extended reality device can further display one or more visual elements within the extended reality graphical user interface and receive user input that targets those visual elements. In particular, an extended reality device can include any device capable of presenting a full or partial extended reality environment.

In some examples, an extended reality computing device includes a display structure that is placed over eyes of a user to display content to the user. The display structure may include one or more input devices (e.g., microphones, speakers, buttons, sensors, etc.) and one or more output devices (e.g., displays, projectors, speakers, etc.) that are contained within a housing of the extended reality computing device. The housing of the headset may also house one or more other components of the headset. For example, the headset may include the stacked printed circuit board architecture described here, which may include or be coupled to one or more other electrical components.

In examples, the computing device may be required to run intensive software and can benefit from the heat management and dissipation of the stack-PCB architecture described herein. For example, some of the types of software (e.g., extended reality, gaming, video rendering, animation, computer aided design, etc.) running on a computing device can be computationally intensive and therefore generate considerable amounts of heat. In examples, the stack-PCB architecture as described can distribute and dissipate the generated heat more effectively than conventional systems. This in turn may allow for more efficient functionality with decreased risk of overheating.

The computer-readable media 714 may also store data usable by the various instructions modules 716 and generated by the various components 702-708. The stored data 718 is not particularly limited and may include sensor data, program data, output data, transfer functions or the like.

The foregoing description has been presented for illustration; it is not intended to be exhaustive or to limit the scope of the disclosure to the precise forms disclosed. Persons skilled in the relevant art can appreciate that many modifications and variations are possible considering the above disclosure.

Some portions of this description describe the examples in terms of algorithms and symbolic representations of operations on information. These algorithmic descriptions and representations may be used by those skilled in the data processing arts to convey the substance of their work effectively to others skilled in the art. These operations, while described functionally, computationally, or logically, are understood to be implemented by computer programs or equivalent electrical circuits, microcode, or the like. The described operations and their associated components may be embodied in software, firmware, hardware, or any combinations thereof.

Any of the steps, operations, or processes described herein may be performed or implemented with one or more hardware or software modules, alone or in combination with other devices. In examples, a software module is implemented with a computer program product comprising a computer-readable medium containing computer program code, which can be executed by a computer processor for performing any or all the steps, operations, or processes described.

Examples may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Examples may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A stack printed circuit board architecture comprising:
a heat spreader comprising a first side and a second side, the second side being opposite the first side,
a first printed circuit board coupled to the first side of the heat spreader;
a second printed circuit board separate from the first printed circuit board;
one or more complementary elements coupled to the second side of the heat spreader, and
an interposer located at the first side of the heat spreader and interposed between the first printed circuit board and the second printed circuit board, wherein the interposer includes a frame having one or more openings disposed within an interior of the interposer.

2. The stack printed circuit board architecture of claim 1, wherein the heat spreader comprises a vapor chamber.

3. The stack printed circuit board architecture of claim 1, wherein the first printed circuit board comprises a system on chip printed circuit board connected to the first side of the heat spreader, and the second printed circuit board comprises a functional printed circuit board.

4. The stack printed circuit board architecture of claim 3, wherein the one or more complementary elements comprise one or more additional printed circuit boards.

5. The stack printed circuit board architecture of claim 4, wherein the one or more additional printed circuit boards comprise at least two additional printed circuit boards.

6. The stack printed circuit board architecture of claim 4, wherein the one or more additional printed circuit boards comprise at least one of a sensor board, an optics board, or an inertia board.

7. The stack printed circuit board architecture of claim 1, wherein the first printed circuit board and the second printed circuit board are arranged in parallel and comprise one or more solder connections.

8. The stack printed circuit board architecture of claim 1, wherein a first number of the one or more printed circuit boards coupled to the first side of the heat spreader is equal to a second number of the one or more printed circuit boards coupled to the second side of the heat spreader.

9. The stack printed circuit board architecture of claim 1, wherein at least one of the first printed circuit board or the second printed circuit board comprise at least one of:
a transistor;
a diode;
an integrated circuit;
a resistor;
a capacitor;
a functional printed circuit board; or
a system on a chip printed circuit board.

10. The stack printed circuit board architecture of claim 1, wherein the heat spreader comprises a plate with a graphite core.

11. The stack printed circuit board architecture of claim 1, wherein at least one of the first circuit board or the second circuit board is directly coupled to the one or more complementary elements.

12. The stack printed circuit board architecture of claim 1, wherein the opening of the frame of the interposer is configured to receive at least one electrical component.

13. A method of forming an electronic device comprising:
stacking a first printed circuit board on a first side of a heat spreader;
stacking an interposer on the first printed circuit board, wherein the interposer includes a frame having one or more openings disposed within an interior of the interposer;
stacking a second printed circuit board on the interposer such that the interposer is interposed between the first printed circuit board and the second circuit board; and
stacking one or more complementary elements on a second side of the heat spreader.

14. The method of claim 13, wherein stacking at least one of the first printed circuit board or the second printed circuit board comprises:
electrically connecting a system on chip printed circuit board to the heat spreader via first connections;
electrically connecting the interposer to the system on chip printed circuit board via second connections;
electrically connecting a functional printed circuit board to the interposer via third connections; and
coupling the system on chip printed circuit board, the interposer, and the functional printed circuit board to the heat spreader via one or more fasteners.

15. The method of claim 14, wherein each of the first connections, the second connections, and the third connections comprise solder connections.

16. The method of claim 14, wherein connecting a functional printed circuit board to the interposer comprises connecting a radio frequency printed circuit board to the interposer.

17. The method of claim 13, wherein stacking one or more complementary elements comprises:
connecting to the second side of the heat spreader at least one of a sensor board, an optics board, or an inertia board.

18. The method of claim 13, wherein the heat spreader comprises a vapor chamber and the stacking of one or more printed circuit boards comprises connecting at least one printed circuit board to the first side of the vapor chamber using a first fastener, and the stacking of one or more complementary elements comprises connecting at least one complementary element to the second side of the vapor chamber using a second fastener.

19. A computing device comprising a stack printed circuit board architecture comprising:
a heat spreader comprising a first side and a second side, the second side being opposite the first side,
a first printed circuit board coupled to the first side of the heat spreader;
a second printed circuit board separate from the first printed circuit board;
one or more complementary elements coupled to the second side of the heat spreader; and
an interposer located at the first side of the heat spreader and interposed between the first printed circuit board and the second printed circuit board, wherein the interposer includes a frame having one or more openings disposed within an interior of the interposer.

20. The computing device of claim 19, wherein the computing device comprises a head-mounted wearable device.

* * * * *